US009960208B2

(12) United States Patent
Lee

(10) Patent No.: US 9,960,208 B2
(45) Date of Patent: May 1, 2018

(54) OLED DISPLAY PANEL HAVING OPENING ZONE FOR EXPOSING SUB-PIXEL SUB-REGIONS, AND METHOD FOR MANUFACTURING THE SAME

(71) Applicant: BOE TECHNOLOGY GROUP CO., LTD., Beijing (CN)

(72) Inventor: Chung-Chun Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/121,029

(22) PCT Filed: Aug. 19, 2015

(86) PCT No.: PCT/CN2015/087552
§ 371 (c)(1),
(2) Date: Aug. 23, 2016

(87) PCT Pub. No.: WO2016/145783
PCT Pub. Date: Sep. 22, 2016

(65) Prior Publication Data
US 2017/0012085 A1  Jan. 12, 2017

(30) Foreign Application Priority Data

Mar. 19, 2015  (CN) .......................... 2015 1 0121522

(51) Int. Cl.
*H01L 27/32* (2006.01)
*H01L 51/56* (2006.01)
*H01L 51/52* (2006.01)

(52) U.S. Cl.
CPC ...... *H01L 27/3213* (2013.01); *H01L 27/3232* (2013.01); *H01L 27/3244* (2013.01);
(Continued)

(58) Field of Classification Search
CPC ......................... H01L 51/5281; H01L 51/5293
See application file for complete search history.

(56) References Cited

U.S. PATENT DOCUMENTS

2004/0198129 A1* 10/2004 Chang ................. H01L 51/5281
445/24
2006/0034051 A1* 2/2006 Wang ................. H05K 7/20209
361/696
(Continued)

FOREIGN PATENT DOCUMENTS

CN    102709309 A    10/2012
CN    103337510 A    10/2013
(Continued)

OTHER PUBLICATIONS

Machine translation, Tian, CN 104360540, translation date: Jul. 26, 2017, Espacenet, all pages.*
(Continued)

*Primary Examiner* — Victoria K Hall
(74) *Attorney, Agent, or Firm* — Kinney & Lange, P.A.

(57) ABSTRACT

An OLED display panel includes: two substrates opposite to each other; a plurality of pixel regions disposed between inner sides of the two substrates and each comprising a blue sub-pixel sub-region, a green sub-pixel sub-region and a red sub-pixel sub-region; and a circularly polarizing plate disposed at an outer side of one of the substrates on a light outgoing side of the display panel; wherein, an opening zone is within a projection area where a projection of each of the pixel regions on the circularly polarizing plate in a thickness direction of the display panel is located, and through the opening zone the corresponding sub-pixel sub-regions are exposed. A method for manufacturing an OLED display panel and a display apparatus having the OLED display panel are also disclosed.

15 Claims, 8 Drawing Sheets

(52) U.S. Cl.
CPC .......... *H01L 51/5281* (2013.01); *H01L 51/56* (2013.01); *H01L 27/322* (2013.01); *H01L 27/3211* (2013.01)

(56) References Cited

U.S. PATENT DOCUMENTS

| | | | | |
|---|---|---|---|---|
| 2007/0069635 | A1* | 3/2007 | Cok | H01L 27/322 313/504 |
| 2008/0054802 | A1* | 3/2008 | Cok | H01L 51/5284 313/506 |
| 2014/0027724 | A1* | 1/2014 | Lim | H01L 51/5281 257/40 |
| 2014/0043683 | A1 | 2/2014 | Jo et al. | |
| 2014/0353625 | A1* | 12/2014 | Yi | H01L 51/5253 257/40 |
| 2014/0353626 | A1* | 12/2014 | Shim | G02B 3/0037 257/40 |
| 2015/0162390 | A1* | 6/2015 | Wang | H01L 27/326 257/40 |
| 2016/0035991 | A1* | 2/2016 | Yamae | H01L 51/5004 257/40 |
| 2016/0049614 | A1* | 2/2016 | Gao | G02B 5/3033 257/40 |
| 2016/0197311 | A1* | 7/2016 | Lamansky | H01L 51/5275 257/40 |
| 2016/0293892 | A1* | 10/2016 | Yamae | H01L 51/5268 |
| 2017/0256752 | A1* | 9/2017 | Gee | H01L 51/5281 |

FOREIGN PATENT DOCUMENTS

| | | |
|---|---|---|
| CN | 103682156 A | 3/2014 |
| CN | 103728765 A | 4/2014 |
| CN | 104218053 A | 12/2014 |
| CN | 104360540 A | 2/2015 |
| CN | 104659075 A | 5/2015 |

OTHER PUBLICATIONS

Machine translation, Wang, CN 103337510, translation date: Jul. 26, 2017, Espacenet, all pages.*
International Search Report and Written Opinion (including English translation of Box V) dated Nov. 25, 2015, for corresponding PCT Application No. PCT/CN2015/087552.
First Chinese Office Action, for Chinese Patent Application No. 201510121522.1, dated Mar. 27, 2017, 12 pages.

* cited by examiner

OLED DISPLAY PANEL HAVING OPENING ZONE FOR EXPOSING SUB-PIXEL SUB-REGIONS, AND METHOD FOR MANUFACTURING THE SAME

BACKGROUND

1. Technical Field

Embodiments of the present invention relate to the field of display technology, and particularly to an organic light emitting diode (OLED) display panel and a method for manufacturing the same, and, a display apparatus including the OLED display panel.

2. Description of the Related Art

In order to prevent the decrease of visual quality caused by indoor and outdoor intense light reflection, a circularly polarizing plate is generally attached to a display terminal of a display screen in the design of an Active Matrix Organic Light Emitting Diode (AMOLED) display apparatus. Extraneous light is turned to polarized light after passing through the circularly polarizing plate, and then becomes abnormally polarized light after being reflected by a reflection electrode of the OLED. As a result, it cannot pass through the circularly polarizing plate and into human eyes. Thereby, reflectance rate can be drop considerably, ensuring display performance of the display screen under indoor and outdoor intense light.

However, conventional circularly polarizing plate has a transmittance of only about 42%, which means that nearly 60% of amount of the outgoing light from the OLED is blocked by the circularly polarizing plate. This problem causes high power consumption of the AMOLED. Meanwhile, the OLED needs to emit the required light intensity with 2.5 times current density, which results in a shorter life of the OLED, as well as overheat caused by excessive current on integrated circuit (IC), easy damage of the components and the like. These are the problems which are urgent to be solved at present.

SUMMARY

In accordance with an aspect of embodiments of the present invention, there provides an OLED display panel comprising: two substrates opposite to each other; a plurality of pixel regions disposed between inner sides of the two substrates and each comprising a blue sub-pixel sub-region, a green sub-pixel sub-region and a red sub-pixel sub-region; and a circularly polarizing plate disposed at an outer side of one of the substrates on a light outgoing side of the display panel; wherein, an opening zone is within a projection area where a projection of each of the pixel regions on the circularly polarizing plate in a thickness direction of the display panel is located, and through the opening zone the corresponding sub-pixel sub-regions are exposed.

In accordance with another aspect of embodiments of the present invention, there provides a display apparatus comprising the abovementioned OLED display panel.

In accordance with still another aspect of embodiments of the present invention, there provides a method for manufacturing an OLED display panel, and, the method comprises the following steps of: providing two substrates that are opposite to each other, and a plurality of pixel regions that are disposed between inner sides of the two substrates and each comprise a blue sub-pixel sub-region, a green sub-pixel sub-region and a red sub-pixel sub-region; attaching a circularly polarizing plate at an outer side of one of the substrates on a light outgoing side of the display panel; and patterning the circularly polarizing plate such that, an opening zone is formed within a projection area where a projection of each of the pixel regions on the circularly polarizing plate in a thickness direction of the display panel is located, and through the opening zone the corresponding sub-pixel sub-regions are exposed.

BRIEF DESCRIPTION OF THE DRAWINGS

Features and advantages of the present invention will become apparent and more readily appreciated from the accompanying drawings. It should be understood that the accompanying drawings is used for schematic purposes, but not to limit the present invention. In the accompanying drawings.

DETAILED DESCRIPTION OF THE EMBODIMENTS

Figure 1:
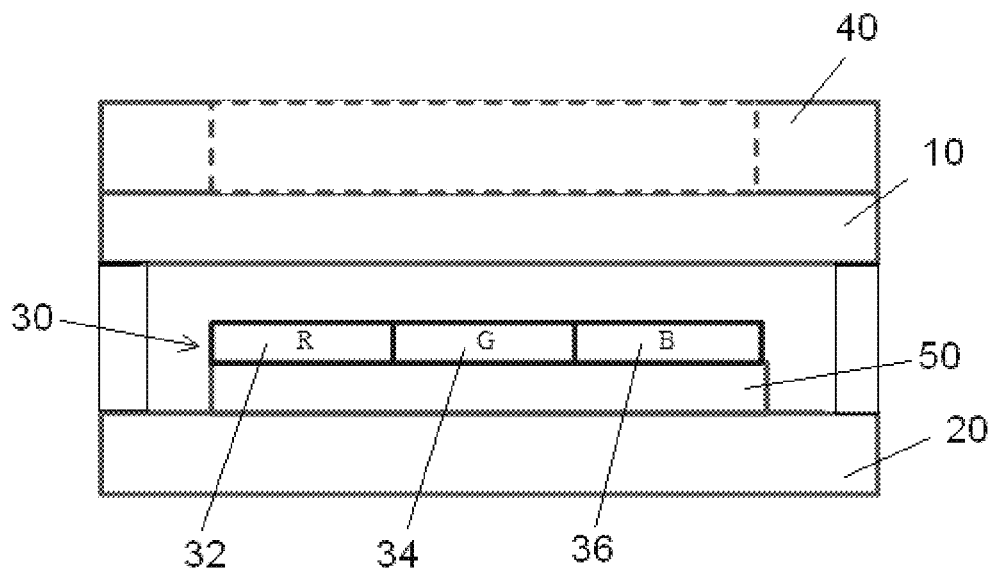
FIG. 1 is a schematic view showing a structure of an OLED display panel according to a first exemplary embodiment of the present invention.

In order to provide a more clear understanding of objects, technique solutions and advantages of the present invention, the present invention will be further described hereinafter in detail in conjunction with specific embodiments and with reference to the attached drawings.

In addition, in the following description, lots of the details are expounded to provide a full understanding of these embodiments of the present invention, for explanation purposes. Obviously, however, one or more embodiments can be implemented without involving these details. In other situations, well-known structures and devices are illustrated by a way of representations in order to simplify the drawings.

An OLED display panel, a display apparatus and a method for manufacturing an OLED display panel according to the embodiments of the present invention will be described and explained hereafter with reference to the attached drawings.

Sizes and shapes of these components in the attached drawings do not reflect actual proportions of the OLED display panel, but are only purposed to schematically illustrate contents of the present invention.

Referring to FIGS. 1-14, the present invention provides an OLED display panel comprising:

two substrates 10, 20 opposite to each other;

a plurality of pixel regions 30 disposed between inner sides of the two substrates 10, 20 and each comprising a blue sub-pixel sub-region 36, a green sub-pixel sub-region 34 and a red sub-pixel sub-region 32; and a circularly polarizing plate 40 disposed at an outer side of one 10 of the substrates on a light outgoing side of the display panel;

wherein:

an opening zone H is within a projection area P where a projection of each of the sub-pixel sub-regions on the circularly polarizing plate 40 in a thickness direction of the display panel is located, the opening zone H has an area accounting for 10%-60% of a total area of the corresponding projection area P, and through the opening zone H the corresponding sub-pixel sub-region is exposed.

Conventional circularly polarizing plate has a light transmittance of only about 42%, however, in the technical solutions of the present invention, a light transmittance of the circularly polarizing plate 40 can be increased, by forming openings in the projection areas P of the circularly polarizing plate 40 corresponding to the sub-pixel sub-regions, namely by forming the opening zones H. With the increased light transmittance of the circularly polarizing plate 40, power consumption of the OLED display panel can be reduced and current density of the OLED can fall, which help to prolong a service life of the OLED. Meanwhile, corresponding IC current can also be reduced, which alleviates problems including excessive current on the IC, easy damage of the components and the like.

According to the present invention, the opening zone H has an area accounting for 10%-60% of a total area of the corresponding projection area P. If the opening zone H has an area less than 10% of the total area of the corresponding projection area P, provision of the opening zone H does not bring any obvious effect, or even only increase the cost for provision of the opening zone H. If the opening zone H has an area greater than 60% of the total area of the corresponding projection area P, more intense light is likely to go into human eyes through the opening zone after being reflected by a reflection electrode, so it is difficult to ensure the display performance under indoor and outdoor intense light.

An OLED display panel according to the present invention will be described and explained in detail hereafter by referring to these specific embodiments of FIGS. 1-14.

Figure 2:
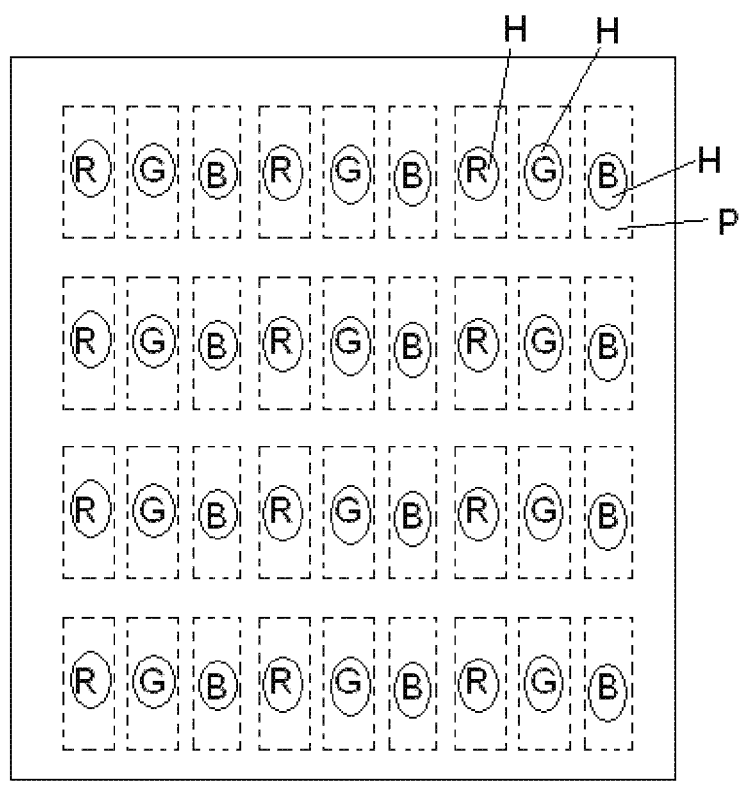
FIG. 2 is a top view showing a part of the OLED display panel of FIG. 1.

FIG. 1 is a schematic view showing a structure of an OLED display panel according to a first exemplary embodiment of the present invention. FIG. 2 is a top view showing a part of the OLED display panel of FIG. 1. As an example, FIG. 1 shows a FMM (Fine Metal Mark) RGB top emission type AMOLED display panel where RGB are in a bar arrangement.

In FIG. 1, blue sub-pixel sub-regions, green sub-pixel sub-regions and red sub-pixel sub-regions are formed directly by the OLED. A pixel driving layer 50 is disposed on a substrate 20, and the pixel driving layer 50 comprises a thin film transistor array and a passivation layer located on the thin film transistor array, as well as structures such as flattening layer, buffer layer and the like may be included according to design requirement. The pixel driving layer 50 is provided thereon with a pixel region 30 formed by the OLED and including blue sub-pixel sub-regions 36, green sub-pixel sub-regions 34 and red sub-pixel sub-regions 32.

As shown in FIG. 1, the OLED display panel is provided thereon with a patterned circularly polarizing plate 40 (the "patterned" mentioned here indicates forming the above-mentioned opening zones H in the circularly polarizing plate). In particular, referring to FIG. 2, each of areas of the circularly polarizing plate 40 where blue, green, red sub-pixels B, G, R are projected is removed by 30%. As a result, the light transmittance of the circularly polarizing plate 40 is increased so that efficiency of the OLED is improved. Overall, with the embodiment of FIG. 1 and FIG. 2, power consumption and the current of the whole OLED display panel may be decreased by about 25%.

Optionally, although it is not shown, for the circularly polarizing plate in the OLED display panel of FIG. 1, each of areas of the circularly polarizing plate 40 where blue, green, red sub-pixels B, G, R are projected may be removed by 50%. As a result, the light transmittance of the circularly polarizing plate 40 is increased so that efficiency of the OLED is improved. Overall, with the embodiment of FIG. 1 and FIG. 2, power consumption and the current of the whole OLED display panel may be decreased by about 40%.

Optionally, although it is not shown, area ratios of the opening zones corresponding to different sub-pixel sub-regions and the corresponding projection areas are not exactly the same. For example, in FIG. 1, areas of the circularly polarizing plate 40 where blue, green, red sub-pixels B, G, R are projected may be removed respectively by 50%, 25%, and 50%. Correspondingly, power consumption and the current of the whole OLED display panel may be decreased by about 33%.

Figure 3:
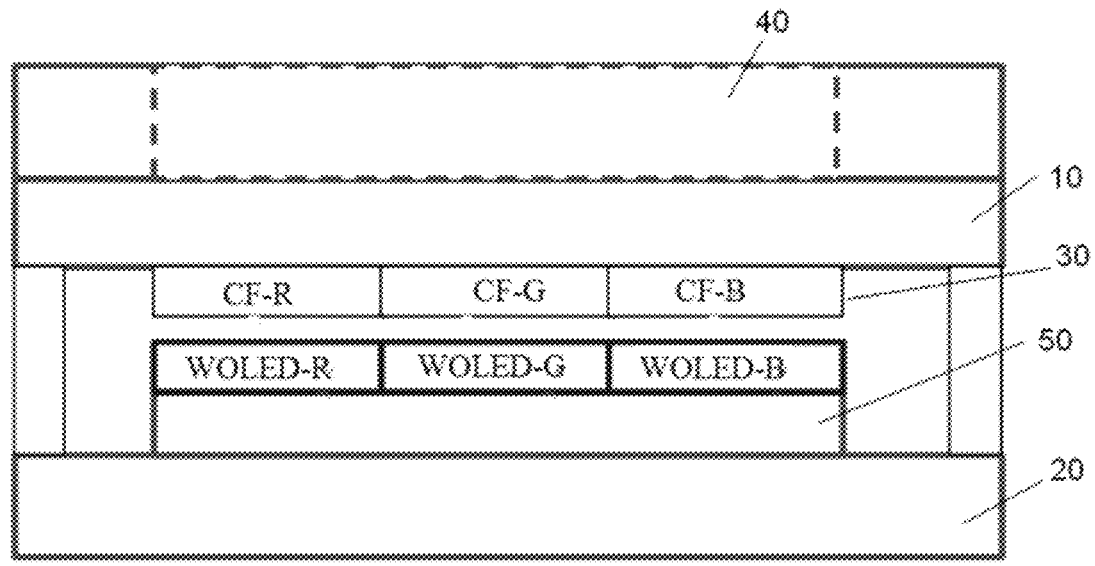
FIG. 3 is a schematic view showing a structure of an OLED display panel according to a second exemplary embodiment of the present invention.
Figure 4:
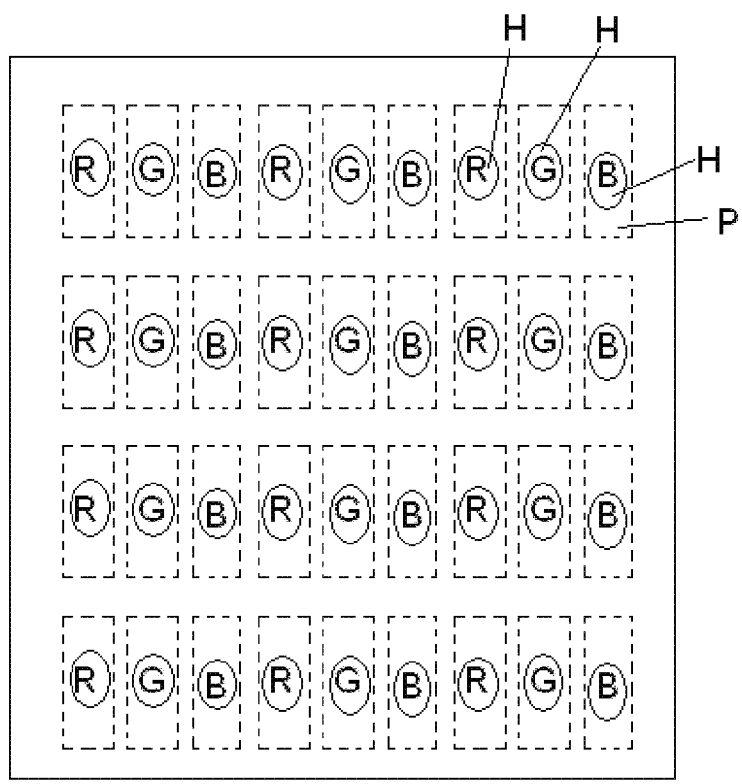
FIG. 4 is a top view showing a part of the OLED display panel of FIG. 3.

FIG. 3 is a schematic view showing a structure of an OLED display panel according to a second exemplary embodiment of the present invention. FIG. 4 is a top view showing a part of the OLED display panel of FIG. 3. As an example, FIG. 3 shows a WOLED (White OLED)+CF (Color Filter) top emission type AMOLED display panel where RGB are in a bar arrangement.

In FIG. 3, in a light outgoing direction, WOLEDs corresponding to the respective CFs are disposed respectively at the rear, and blue sub-pixel sub-regions B, green sub-pixel sub-regions G and red sub-pixel sub-regions R can be represented directly by corresponding CF-X (for example, CF-B, CF-G and CF-R). The substrate 20 is provided thereon with a pixel driving layer 50, and the WOLEDs are disposed on the pixel driving layer 50. The CFs are disposed on the substrate 10.

As shown in FIG. 3, the OLED display panel is provided thereon with a patterned circularly polarizing plate 40 (the "patterned" mentioned here indicates forming the above-mentioned opening zones H in the circularly polarizing plate). In particular, referring to FIG. 4, each of areas of the circularly polarizing plate 40 where blue, green, red sub-pixels B, G, R are projected is removed by 30%. As a result, the light transmittance of the circularly polarizing plate 40 is increased so that efficiency of the OLED is improved. Overall, with the embodiment of FIG. 3 and FIG. 4, power consumption and the current of the whole OLED display panel can be decreased by about 25%

Optionally, although it is not shown, area ratios of the opening zones corresponding to different sub-pixel sub-regions and the corresponding projection areas are not exactly the same. For example, in FIG. 3, areas of the circularly polarizing plate 40 where blue, green, red sub-pixels B, G, R are projected may be removed respectively by 50%, 25%, and 50%. Correspondingly, power consumption and the current of the whole OLED display panel can be decreased by about 33%.

Figure 5:
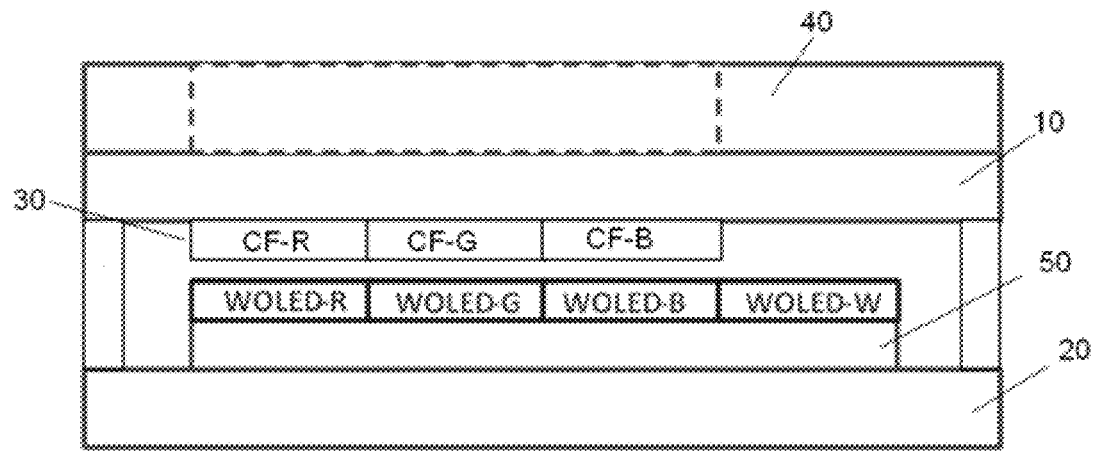
FIG. 5 is a schematic view showing a structure of an OLED display panel according to a third exemplary embodiment of the present invention.
Figure 6:
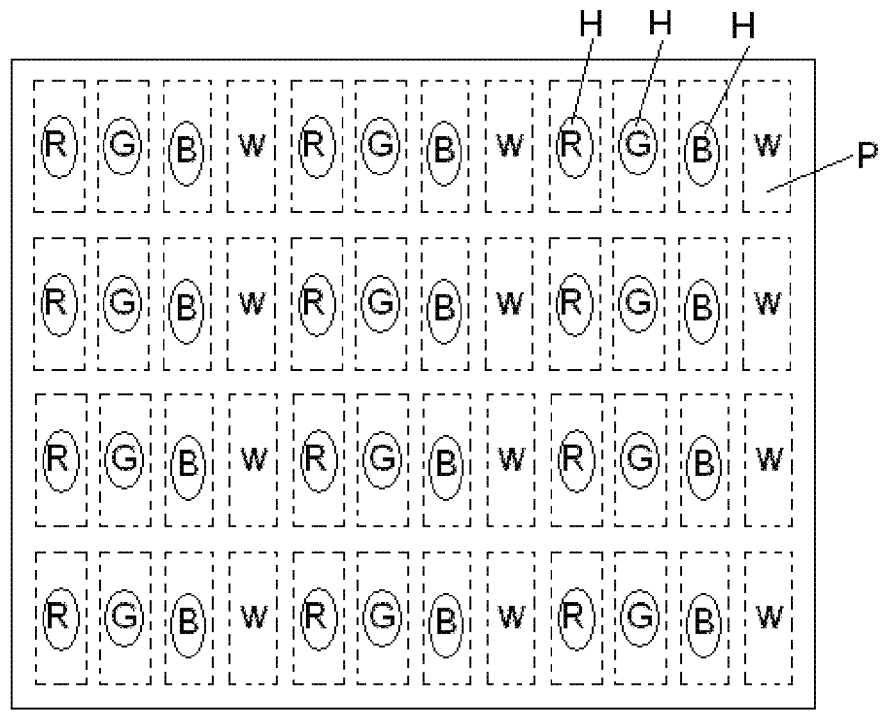
FIG. 6 is a top view showing a part of the OLED display panel of FIG. 5.

FIG. 5 is a schematic view showing a structure of an OLED display panel according to a third exemplary embodiment of the present invention. FIG. 6 is a top view showing a part of the OLED display panel of FIG. 5. As an example, FIG. 5 shows a WOLED (White OLED)+CF (Color Filter) top emission type AMOLED display panel where RGBW are in a bar arrangement.

In FIG. 5, in a light outgoing direction, WOLEDs corresponding to the respective CFs are disposed respectively at the rear, and blue sub-pixel sub-regions, green sub-pixel sub-regions and red sub-pixel sub-regions can be represented directly by corresponding CF-X (for example, CF-B, CF-G and CF-R). The substrate 20 is provided thereon with a pixel driving layer 50, and the WOLEDs are disposed on the pixel driving layer 50. The CFs are disposed on the substrate 10.

As shown in FIG. 5, the OLED display panel is provided thereon with a patterned circularly polarizing plate 40 (i.e., the abovementioned opening zones H are formed in the circularly polarizing plate). In particular, referring to FIG. 6, each of areas of the circularly polarizing plate 40 where blue, green, red sub-pixels B, G, R are projected is removed by 30%. As a result, the light transmittance of the circularly polarizing plate 40 is increased so that efficiency of the OLED is improved. Overall, with the embodiment of FIG. 5 and FIG. 6, power consumption and the current of the whole OLED display panel can be decreased by about 17%

The abovementioned embodiments describe the technical solution as follows. An opening zone is within a projection area where a projection of each of the sub-pixel sub-regions on the circularly polarizing plate in the thickness direction of the display panel is located, and the opening zone has an area accounting for 10%-60% of a total area of the corresponding projection area. An opening is formed in a region of the circularly polarizing plate corresponding to a projection of each of the sub-pixel sub-regions.

In accordance with the present invention, however, the opening formed in the region of the circularly polarizing plate corresponding to the projection of each of the sub-pixel sub-regions may also expose the entire corresponding sub-pixel sub-region. In addition, it is not necessary to form an opening in the region of the circularly polarizing plate corresponding to a projection of every sub-pixel sub-region in one pixel region.

Figure 7:
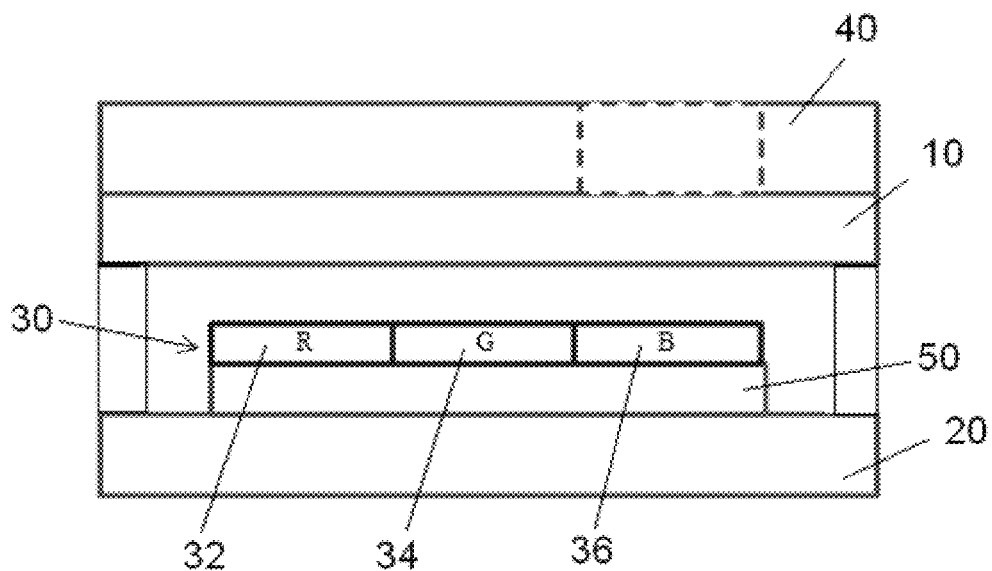
FIG. 7 is a schematic view showing a structure of an OLED display panel according to a fourth exemplary embodiment of the present invention.
Figure 8:
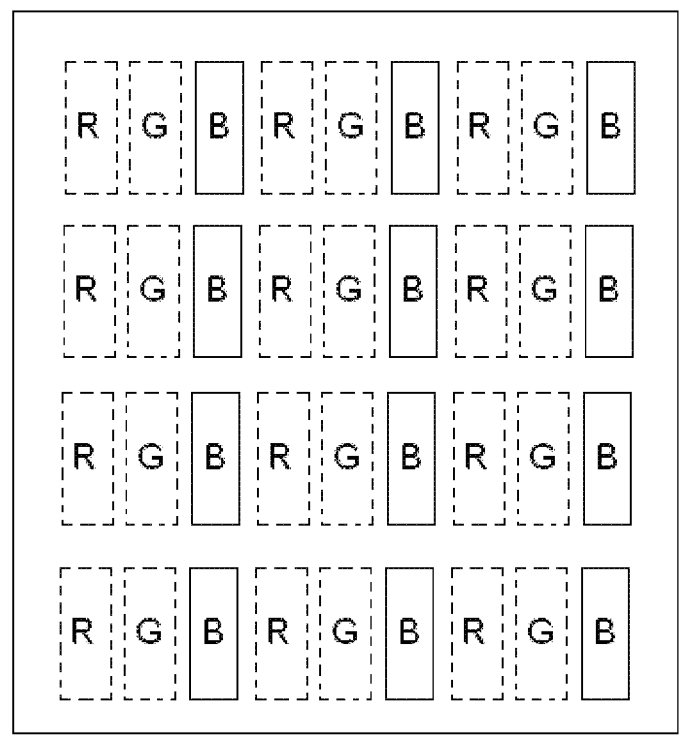
FIG. 8 is a top view showing a part of the OLED display panel of FIG. 7.

FIG. 7 is a schematic view showing a structure of an OLED display panel according to a fourth exemplary embodiment of the present invention. FIG. 8 is a top view showing a part of the OLED display panel of FIG. 7. In the fourth embodiment, areas of the circularly polarizing plate where blue sub-pixels B are projected are completely removed. In FIG. 8, solid line boxes denote areas of the circularly polarizing plate corresponding to the blue sub-pixels B are completely removed to expose the sub-pixel sub-regions. As a result, the blue sub-pixels B have 2.5 times increase in efficiency, and power consumption and the current of the whole display panel are decreased by 26%.

Figure 9:
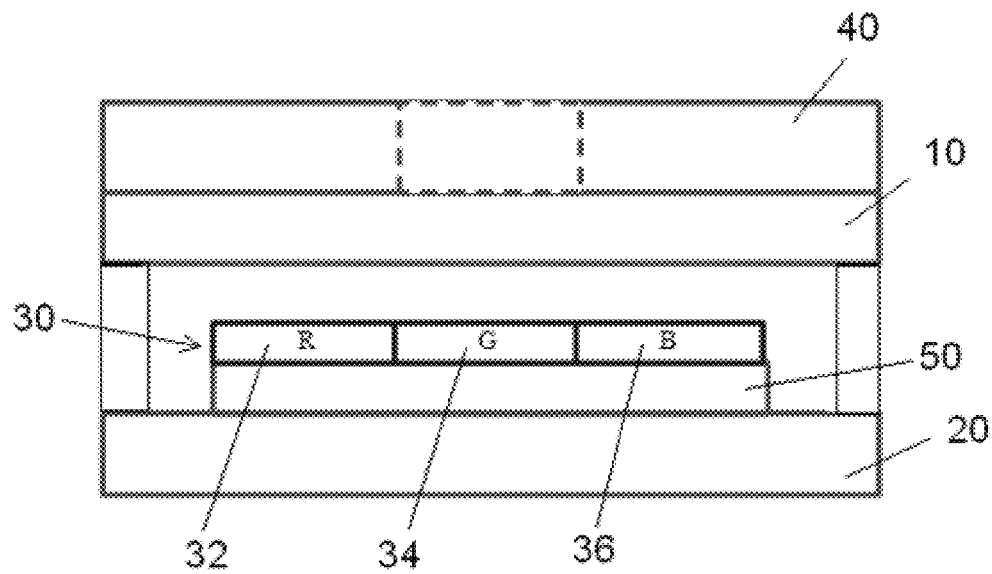
FIG. 9 is a schematic view showing a structure of an OLED display panel according to a fifth exemplary embodiment of the present invention.
Figure 10:
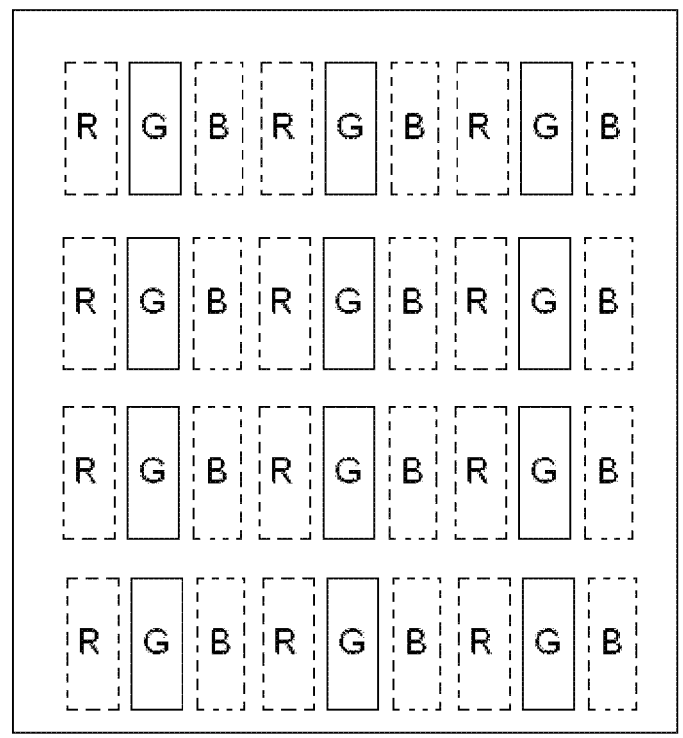
FIG. 10 is a top view showing a part of the OLED display panel of FIG. 9.

FIG. 9 is a schematic view showing a structure of an OLED display panel according to a fifth exemplary embodiment of the present invention. FIG. 10 is a top view showing a part of the OLED display panel of FIG. 9. In the fifth embodiment, areas of the circularly polarizing plate where green sub-pixels G are projected are completely removed. In FIG. 10, solid line boxes denote areas of the circularly polarizing plate corresponding to the green sub-pixels G are completely removed to expose the sub-pixel sub-regions. As a result, the green sub-pixels G have 2.5 times increase in efficiency, and power consumption and the current of the whole display panel are decreased by 13%.

Although it is not shown, for the structures of the OLED display panels of FIG. 7 and FIG. 9, for example, areas of the circularly polarizing plate where blue sub-pixels B and red sub-pixels R are projected may be completely removed. As a result, the blue sub-pixels B and red sub-pixels R have 2.5 times increase in efficiency, and power consumption and the current of the whole display panel are decreased by 45%.

Figure 11:
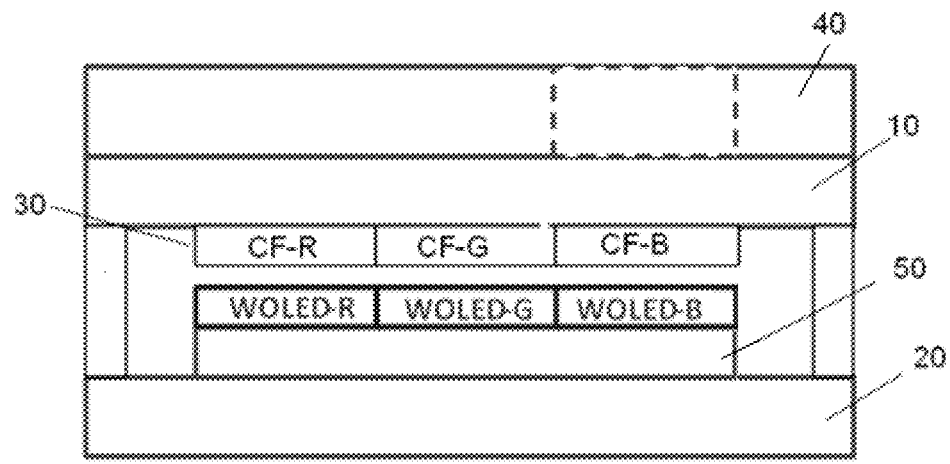
FIG. 11 is a schematic view showing a structure of an OLED display panel according to a sixth exemplary embodiment of the present invention.
Figure 12:
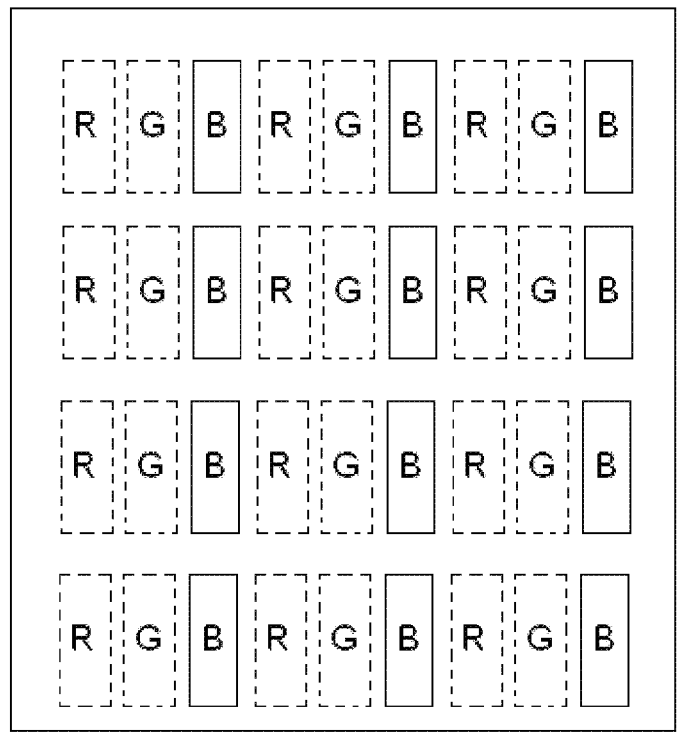
FIG. 12 is a top view showing a part of the OLED display panel of FIG. 11.

FIG. 11 is a schematic view showing a structure of an OLED display panel according to a sixth exemplary embodiment of the present invention. FIG. 12 is a top view showing a part of the OLED display panel of FIG. 11. As an example, FIG. 11 shows a WOLED (White OLED)+CF (Color Filter) top emission type AMOLED display panel where RGBW are in a bar arrangement.

In FIG. 11, in a light outgoing direction, WOLEDs corresponding to the respective CFs are disposed respectively at the rear, and blue sub-pixel sub-regions, green sub-pixel sub-regions and red sub-pixel sub-regions can be represented directly by corresponding CF-X (for example, CF-B, CF-G and CF-R). The substrate 20 is provided thereon with a pixel driving layer 50, and the WOLEDs are disposed on the pixel driving layer 50. The CFs are disposed on the substrate 10.

In the sixth embodiment, areas of the circularly polarizing plate where blue sub-pixels B are projected are completely removed. In FIG. 12, solid line boxes denote areas of the circularly polarizing plate corresponding to the blue sub-pixels B are completely removed to expose the sub-pixel sub-regions. As a result, the blue sub-pixels have 2.5 times increase in efficiency, and power consumption and the current of the whole display panel are decreased by 20%.

Although it is not shown, for the structure of the OLED display panel of FIG. 11, for example, areas of the circularly polarizing plate where green sub-pixels G are projected may be completely removed. As a result, the green sub-pixels G have 2.5 times increase in efficiency, and power consumption and the current of the whole display panel are decreased by 10%.

Although it is not shown, for the structure of the OLED display panel of FIG. 11, for example, areas of the circularly polarizing plate where blue sub-pixels B and red sub-pixels R are projected may be completely removed (see FIG. 5). As a result, the blue sub-pixels B and red sub-pixels R have 2.5 times increase in efficiency, and power consumption and the current of the whole display panel are decreased by 35%.

Figure 13:
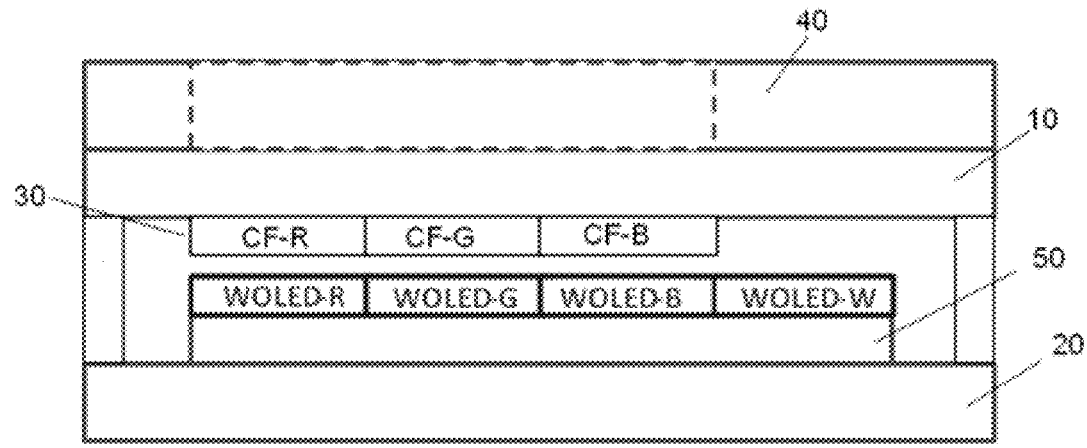
FIG. 13 is a schematic view showing a structure of an OLED display panel according to a seventh exemplary embodiment of the present invention.
Figure 14:
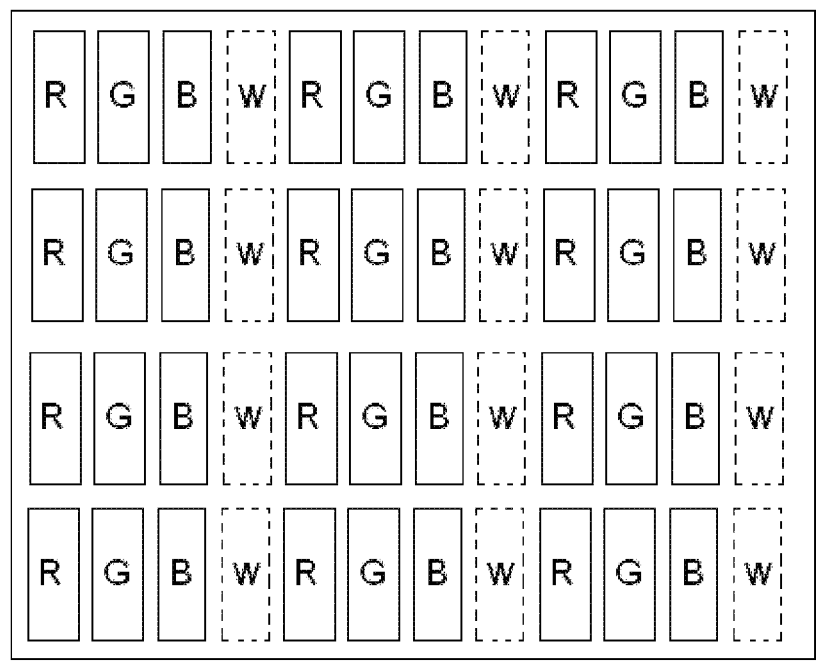
FIG. 14 is a top view showing a part of the OLED display panel of FIG. 13.
Figure 15:
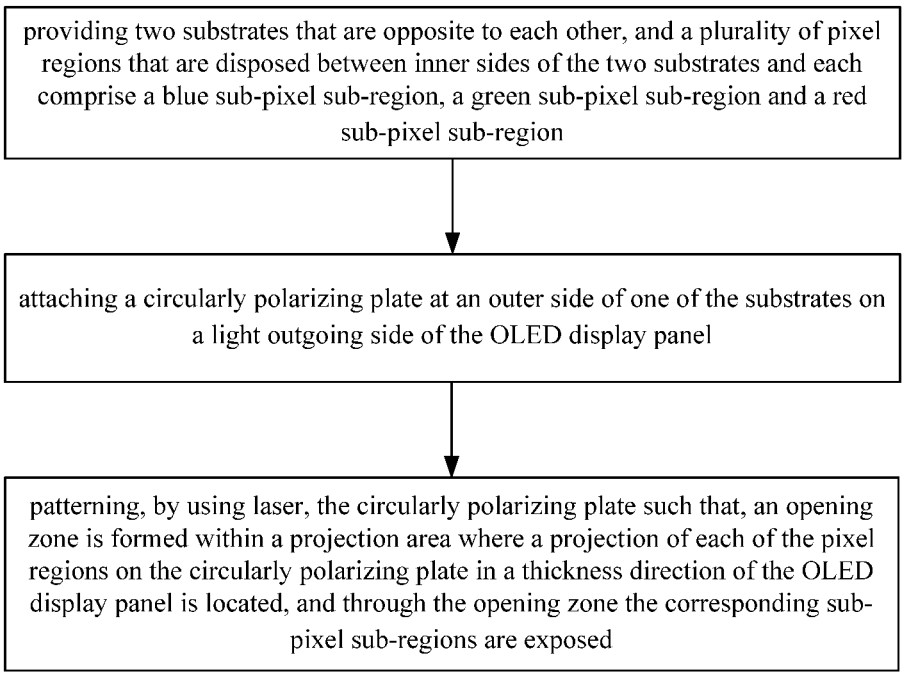
FIG. 15 is a flow diagram of a method for manufacturing an OLED display panel according to an embodiment of the present invention.

FIG. 13 is a schematic view showing a structure of an OLED display panel according to a seventh exemplary embodiment of the present invention. FIG. 14 is a top view showing a part of the OLED display panel of FIG. 13. As an example, FIG. 13 shows a WOLED (White OLED)+CF (Color Filter) top emission type AMOLED display panel where RGBW are in a bar arrangement.

In FIG. 13, in a light outgoing direction, WOLEDs corresponding to the respective CFs are disposed respectively at the rear, and blue sub-pixel sub-regions, green sub-pixel sub-regions and red sub-pixel sub-regions can be represented directly by corresponding CF-X (for example, CF-B, CF-G and CF-R). The substrate 20 is provided thereon with a pixel driving layer 50, and the WOLEDs are disposed on the pixel driving layer 50. The CFs are disposed on the substrate 10.

In the seventh embodiment, areas of the circularly polarizing plate where blue, red, green sub-pixels B, R, G are projected are completely removed. In FIG. 14, solid line boxes denote areas of the circularly polarizing plate corresponding to the blue, red, green sub-pixels B, R, G are completely removed to expose the sub-pixel sub-regions. As a result, the blue, red, green sub-pixels B, R, G have 2.5 times increase in efficiency, and power consumption and the current of the whole display panel are decreased by 13%.

As shown in FIGS. 7-14, for each of the pixel regions, the sub-pixel sub-regions corresponding to the opening zones of the circularly polarizing plate are the same. Specifically, for example, the projection area where the projection of the blue sub-pixel sub-region of one pixel region on the circularly polarizing plate is located is completely removed, and the projection area where the projection of the blue sub-pixel sub-region of each of the other pixel regions on the circularly polarizing plate is located is also completely removed, as shown in FIGS. 8 and 12. Or, the projection areas where the projections of the blue, green and red sub-pixel sub-regions of one pixel region on the circularly polarizing plate are located are completely removed, and, the projection areas where the projections of the blue, green and red sub-pixel sub-regions of each of the other pixel regions on the circularly polarizing plate are located are also completely removed, as shown in FIG. 14.

In the examples of FIGS. 1-14, the display panel is of top emission type. It should be noted that, the circularly polarizing plate according to the present invention can also be applied in a bottom emission type display panel. In addition, the OLED display panel according to the above examples may be an AMOLED display panel.

Concerning the above, the present invention relates to an OLED display panel comprising: two substrates opposite to each other; a plurality of pixel regions disposed between inner sides of the two substrates and each comprising a blue sub-pixel sub-region, a green sub-pixel sub-region and a red sub-pixel sub-region; and a circularly polarizing plate disposed at an outer side of one of the substrates on a light outgoing side of the display panel; wherein, an opening zone is within a projection area where a projection of each of the pixel regions on the circularly polarizing plate in a thickness direction of the display panel is located, and through the opening zone the corresponding sub-pixel sub-regions are exposed.

The present invention further relates to a display apparatus comprising the abovementioned OLED display panel. The display apparatus may be any products or parts having display function, such as mobile phone, tablet PC, TV, display device, notebook PC, digital photo frame, navigating instrument, etc. The display apparatus also has the abovementioned advantages brought by forming opening zones in the circularly polarizing plate.

The present invention further relates to a method for manufacturing an OLED display panel. In a conventional process of manufacturing an OLED display panel, no further treatment to a circularly polarizing plate is performed after attaching the circularly polarizing plate onto the substrate. Compared to conventional method, the method for manufacturing an OLED display panel according to the present invention has added a step of patterning the polarizing plate after attaching the polarizing plate (namely, forming the openings in regions corresponding to the pixel regions).

Correspondingly, a method for manufacturing an OLED display panel according to the inventive concept of the present invention comprises the following steps of:

providing two substrates 10, 20 that are opposite to each other, and a plurality of pixel regions 30 that are disposed between inner sides of the two substrates and each comprise a blue sub-pixel sub-region 36, a green sub-pixel sub-region 34 and a red sub-pixel sub-region 32;

attaching a circularly polarizing plate 40 at an outer side of one of the substrates on a light outgoing side of the display panel; and patterning the circularly polarizing plate such that, an opening zone H is formed within a projection area P where a projection of each of the pixel regions on the circularly polarizing plate in a thickness direction of the display panel is located, and through the opening zone the corresponding sub-pixel sub-regions are exposed.

Optionally, referring to FIGS. 1-6, in the step of patterning the circularly polarizing plate, an opening zone is formed within a projection area where a projection of each of the sub-pixel sub-regions on the circularly polarizing plate in the thickness direction of the display panel is located, and the opening zone has an area accounting for 10%-60% of a total area of the corresponding projection area. Furthermore, the area of the opening zone accounts for 30% or 50% of the total area of the corresponding projection area. Alternatively, area ratios of the opening zones corresponding to different sub-pixel sub-regions and the corresponding projection areas are not exactly the same.

Optionally, referring to FIGS. 7-14, in the step of patterning the circularly polarizing plate, the projection area where the projection of at least one sub-pixel sub-region of the blue sub-pixel sub-regions, the green sub-pixel sub-regions and the red sub-pixel sub-regions of each of the pixel regions on the circularly polarizing plate in the thickness direction of the display panel is located is completely removed to form at least one corresponding opening zone.

Specifically, the circularly polarizing plate 40 may be patterned using laser.

In a top emission type display panel, as shown in FIGS. 1, 3, 5, 7, 9, 11 and 13, a gap is provided between the OLED and the substrate where the circularly polarizing plate 40 is located, so that heat generated during a patterning process using laser basically has no bad effect on the OLED. Even if in a bottom emission type display panel in which CFs are provided between the OLED and inner side of the substrate where the circularly polarizing plate is located, a bad effect of heat generated during a patterning process using laser on the OLED can be decreased.

To etch the circularly polarizing plate using laser can achieve accurate positioning of the opening zones and can accurately control a speed of the etching.

Other methods or processes for forming opening zones in preset locations of the circularly polarizing plate 40 may also be used.

The abovementioned method also has the abovementioned advantages brought by forming opening zones in the circularly polarizing plate.

In addition, in the abovementioned method, the OLED display panel comprises an AMOLED display panel.

Obviously, it would be appreciated by those skilled in the art that various changes or modifications may be made on the present invention without departing from the principles and spirit of the present invention. Accordingly, the present invention intends to contain these changes or modifications if they fall into the scope which is defined in the claims and their equivalents of the present invention.

What is claimed is:

1. An OLED display panel, comprising:
two substrates opposite to each other;
a plurality of pixel regions disposed between inner sides of the two substrates and each comprising a blue sub-pixel sub-region, a green sub-pixel sub-region and a red sub-pixel sub-region; and
a circularly polarizing plate disposed at an outer side of one of the substrates on a light outgoing side of the OLED display panel;
wherein,
an opening zone is within a projection area where a projection of each of the pixel regions on the circularly polarizing plate in a thickness direction of the OLED display panel is located, and through the opening zone the corresponding sub-pixel sub-regions are exposed.

2. The OLED display panel of claim 1, wherein an opening zone is within a projection area where a projection of each of the sub-pixel sub-regions on the circularly polarizing plate in the thickness direction of the OLED display panel is located, and the opening zone has an area accounting for 10%-60% of a total area of the corresponding projection area.

3. The OLED display panel of claim 2, wherein the area of the opening zone accounts for 30% or 50% of the total area of the corresponding projection area.

4. The OLED display panel of claim 2, wherein area ratios of the opening zones corresponding to different sub-pixel sub-regions and projection areas of the different sub-pixel sub-regions on the circularly polarizing plate are not exactly the same.

5. The OLED display panel of claim 1, wherein a projection area where a projection of at least one sub-pixel sub-region of the blue sub-pixel sub-region, the green sub-pixel sub-region and the red sub-pixel sub-region of each of the pixel regions on the circularly polarizing plate in the thickness direction of the OLED display panel is located is completely removed to form at least one corresponding opening zone.

6. The OLED display panel of claim 5, wherein for each of the pixel regions, the sub-pixel sub-regions corresponding to the opening zones of the circularly polarizing plate are the same.

7. The OLED display panel of claim 6, wherein the OLED display panel comprises an AMOLED display panel.

8. A display apparatus, comprising an OLED display panel of claim 1.

9. A method for manufacturing an OLED display panel, wherein the method comprises the following steps of:
providing two substrates that are opposite to each other, and a plurality of pixel regions that are disposed between inner sides of the two substrates and each comprise a blue sub-pixel sub-region, a green sub-pixel sub-region and a red sub-pixel sub-region;
attaching a circularly polarizing plate at an outer side of one of the substrates on a light outgoing side of the OLED display panel; and
patterning the circularly polarizing plate such that an opening zone is formed within a projection area where a projection of each of the pixel regions on the circularly polarizing plate in a thickness direction of the OLED display panel is located, and through the opening zone the corresponding sub-pixel sub-regions are exposed.

10. The method of claim 9, wherein:
in the step of patterning the circularly polarizing plate, an opening zone is formed within a projection area where a projection of each of the sub-pixel sub-regions on the circularly polarizing plate in the thickness direction of the OLED display panel is located, and the opening zone has an area accounting for 10%-60% of a total area of the corresponding projection area.

11. The method of claim 10, wherein:
the area of the opening zone accounts for 30% or 50% of the total area of the corresponding projection area.

12. The method of claim 10, wherein area ratios of the opening zones corresponding to different sub-pixel sub-regions and projection areas of the different sub-pixel sub-regions on the circularly polarizing plate are not exactly the same.

13. The method of claim 9, wherein in the step of patterning the circularly polarizing plate, a projection area where a projection of at least one sub-pixel sub-region of the blue sub-pixel sub-region, the green sub-pixel sub-region and the red sub-pixel sub-region of each of the pixel regions on the circularly polarizing plate in the thickness direction of the OLED display panel is located is completely removed to form at least one corresponding opening zone.

14. The method of claim 9, wherein the circularly polarizing plate is patterned using laser.

15. The method of claim 9, wherein the OLED display panel comprises an AMOLED display panel.

* * * * *